(12) United States Patent
Peng

(10) Patent No.: US 7,611,967 B2
(45) Date of Patent: Nov. 3, 2009

(54) WAFER SAWING METHOD

(75) Inventor: Sheng-Yang Peng, Kaohsiung (TW)

(73) Assignee: Advanced Semiconductor Engineering, Inc., Kaohsiung (TW)

(*) Notice: Subject to any disclaimer, the term of this patent is extended or adjusted under 35 U.S.C. 154(b) by 0 days.

(21) Appl. No.: 12/047,099

(22) Filed: Mar. 12, 2008

(65) Prior Publication Data

US 2008/0261351 A1    Oct. 23, 2008

(30) Foreign Application Priority Data

Apr. 17, 2007    (TW)    ............... 96113436 A

(51) Int. Cl.
    *H01L 21/00*    (2006.01)
(52) U.S. Cl. .................. 438/460; 438/110; 438/462
(58) Field of Classification Search .................. 438/110, 438/460, 462
    See application file for complete search history.

(56) References Cited

U.S. PATENT DOCUMENTS 6,284,569 B1 *    9/2001    Sheppard et al. ............ 438/110

* cited by examiner

*Primary Examiner*—Douglas M Menz
(74) *Attorney, Agent, or Firm*—J. C. Patents

(57) ABSTRACT

A wafer sawing method for sawing a wafer by using a cutting tool is provided. Sawing paths are formed on a surface of the wafer. In the wafer sawing method, a carrier on which strip-shaped adhesives or at least a fiducial mark is formed is firstly provided. The dimension of the carrier is greater than the dimension of the wafer. Next, the surface of the wafer is bonded to the carrier, and the strip-shaped adhesives or the fiducial mark is extended or located outside a bonding region between the wafer and the carrier. Here, the surface of the wafer faces the carrier. The cutting tool and the carrier are positioned according to the strip-shaped adhesives or the fiducial mark outside the bonding region. The wafer is then sawed by using the cutting tool. The wafer sawing method provides a precise and rapid sawing process and achieves superior productive yield.

7 Claims, 11 Drawing Sheets

WAFER SAWING METHOD

CROSS-REFERENCE TO RELATED APPLICATION

This application claims the priority benefit of Taiwan application serial no. 96113436, filed on Apr. 17, 2007. The entirety the above-mentioned patent application is hereby incorporated by reference herein and made a part of specification.

BACKGROUND OF THE INVENTION

1. Field of the Invention

The present invention relates to a semiconductor manufacturing technology, and more particularly, to a wafer sawing method.

2. Description of Related Art

With recent advancement of semiconductors and packaging technologies, the fabrication of micro devices including micro-electromechanical devices or electro-optical devices is currently achieved by adopting a prevailing wafer packaging technique rather than a chip packaging technique. Thereby, packaging costs are reduced, and the requirements for lightweight, slimness, compactness, and small volume are satisfied. Generally, after devices on a wafer are completely manufactured in the wafer packaging process, the wafer is flipped and disposed on a carrier. The devices of each chip on the wafer are bonded to the carrier, so as to form a hermetic space between the carrier and each of the chips. Thereafter, a sawing process is performed on a back surface of the wafer, so as to divide the chips.

Note that a cutting tool is moved along constant sawing paths during a sawing operation implemented on the wafer, and interlacing sawing paths are then formed on the wafer in line with the movement and rotation of a process chamber. Due to lack of a focus point for positioning the cutting tool on the back surface of the wafer, longitudinal standard lines and latitudinal standard lines are required to be formed on the back surface of the wafer at first. Next, the back surface of the wafer is sawed with reference to the longitudinal standard lines and latitudinal standard lines. The bonded chips are then separated by a plurality of longitudinal sawing lines and latitudinal sawing lines.

However, errors arisen from tilt angles or a moving distance of the cutting tool may occur when the cutting tool is moved, and each of the longitudinal sawing lines and each of the latitudinal sawing lines use the previous longitudinal sawing line and the previous latitudinal sawing line as the standard. Accordingly, both the previous longitudinal and latitudinal sawing lines and the aforesaid errors caused by the tilt angles or the moving distance of the cutting tool all pose an impact on each of the longitudinal sawing lines and each of the latitudinal sawing lines when the sawing process is carried out. As such, during the implementation of the wafer sawing process, accumulated errors caused by the tilt angles or the moving distance of the cutting tool are apt to take place after the longitudinal sawing lines and the latitudinal sawing lines are formed, i.e., after the cutting tool longitudinally or latitudinally shifts by an excessive distance. Consequently, when the cutting tool performs the sawing operation on the wafer, it is very much likely to damage the devices or circuits on the chips, resulting in malfunctions of the chips.

On the other hand, the errors occurring in the wafer sawing process may affect the hermetic space between the carrier and each of the chips, resulting in failure to protect the devices on the surfaces of the chips. The devices on the chips may accordingly be contaminated by coolant for the sawing operation or by particles of materials in subsequent processes, reducing process yield of the wafer.

SUMMARY OF THE INVENTION

The present invention is directed to a wafer sawing method in which a precise and rapid cutting process can be performed, and superior manufacturing yield can be achieved.

To embody the present invention, a wafer sawing method adapted for sawing a wafer by using a cutting tool is provided. A plurality of sawing paths is formed on a surface of the wafer. In the wafer sawing method, a carrier whose dimension is greater than the dimension of the wafer is firstly provided. A plurality of strip-shaped adhesives corresponding to the sawing paths is then formed on the carrier. Thereafter, the surface of the wafer is bonded to the carrier. Here, the surface of the wafer faces the carrier, and the sawing paths on the surface of the wafer are bonded to the corresponding strip-shaped adhesives on the carrier. The strip-shaped adhesives are extended outside a bonding region between the wafer and the carrier. Next, the cutting tool and the carrier are positioned according to the strip-shaped adhesives outside the bonding region. The wafer is then sawed along the strip-shaped adhesives by using the cutting tool.

In addition to the formation of the strip-shaped adhesives on the carrier, at least a fiducial mark can be additionally formed on the carrier, such that the cutting tool and the carrier are positioned according to the strip-shaped adhesives and the fiducial mark. Alternatively, at least one fiducial mark is individually formed on the carrier to position the cutting tool and the carrier. The method of forming the fiducial mark includes forming a metallic pattern on the carrier, for example.

According to an embodiment of the present invention, the wafer sawing method further includes sawing the carrier and the wafer simultaneously.

According to an embodiment of the present invention, the carrier is, for example, a silicon substrate, a glass substrate, or a sapphire substrate. Besides, the strip-shaped adhesives may be made of polymer materials including epoxy resin, silicon-carbon resin and silicone, or otherwise made of other appropriate bonding materials.

Moreover, in addition to implementing the aforesaid adhesive bonding by using the strip-shaped adhesives, the method of bonding the wafer to the carrier further includes an anodic bonding, a eutectic bonding, or a fusion bonding.

In the present invention, the cutting tool and the carrier are precisely positioned according to the strip-shaped adhesives or the fiducial mark on the carrier, such that the devices or the circuits on the chips can be prevented from being damaged due to the errors occurring in the sawing process. Moreover, the adverse impact on the hermetic space between the carrier and each of the chips can be avoided as well, so as to ensure the protection for the devices on the chips during the wafer sawing process or the subsequent processes.

In order to make the above and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

In the present invention, strip-shaped adhesives or a fiducial mark is formed on a carrier for positioning a cutting tool and the carrier. A method of forming the strip-shaped adhesives includes applying an adhesive bonding technique through which a plurality of the strip-shaped adhesives corresponding to sawing paths of a wafer is formed by coating the adhesives on the carrier. Besides, during the adhesive coating process, the strip-shaped adhesives are extended outside a bonding region between the wafer and the carrier, such that parts of the strip-shaped adhesives are exposed outside the wafer after the wafer and the carrier are bonded together. The exposed parts of the strip-shaped adhesives can be used for positioning the cutting tool and the carrier. In addition, the fiducial mark can be formed individually or together with the strip-shaped adhesives on the carrier, so as to position the cutting tool and the carrier. The fiducial mark is formed during the fabrication of the carrier, for example, and a material of the fiducial varies upon the method of forming the same. For example, a patterned metallic layer serving as the fiducial mark can be deposited on the carrier. It is of certainty that patterns or the amount of the fiducial mark can be adjusted based on actual demands, which is not limited to the scope disclosed in the following embodiments.

Figure 1:
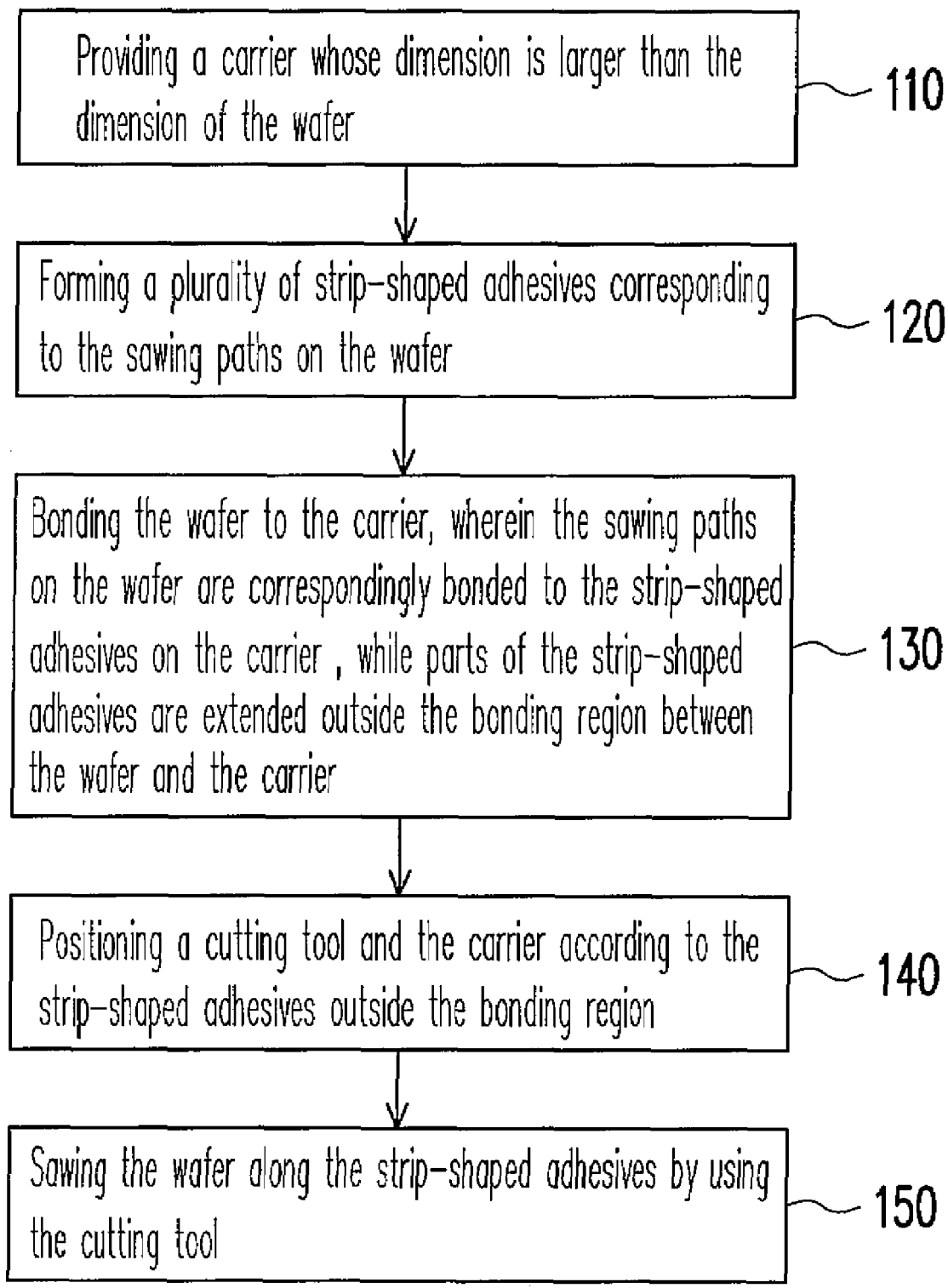
FIG. 1 is a flowchart illustrating a wafer sawing method according to an embodiment of the present invention.
Figure 2A:
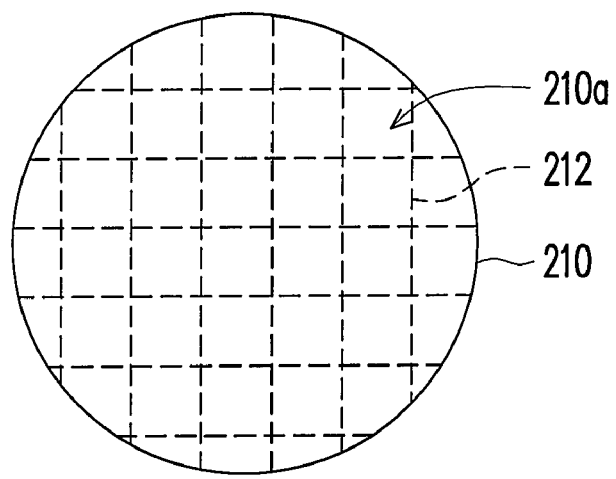
FIG. 2A through 2E are top views sequentially illustrating steps in the wafer sawing method depicted in FIG. 1.

Please refer to FIG. 1 and 2A~2E together. FIG. 1 is a flowchart illustrating a wafer sawing method according to an embodiment of the present invention. FIGS. 2A through 2E are top views sequentially illustrating steps in the wafer sawing method. As shown in FIG. 2A, a plurality of sawing paths 212 is, for example, formed on a surface of a wafer 210, so as to divide the wafer 210 into a plurality of chip units 210a. Micro devices including micro-electromechanical devices or electro-optical devices are already formed on each of the chip units 210a, for example. It should be noted that the sawing paths 212 are referred to as separating lines between each of the chip units 210a on the wafer 210. The separating lines for dividing the chip units 210a are either actual line segments or virtual line segments.

Figure 2B:
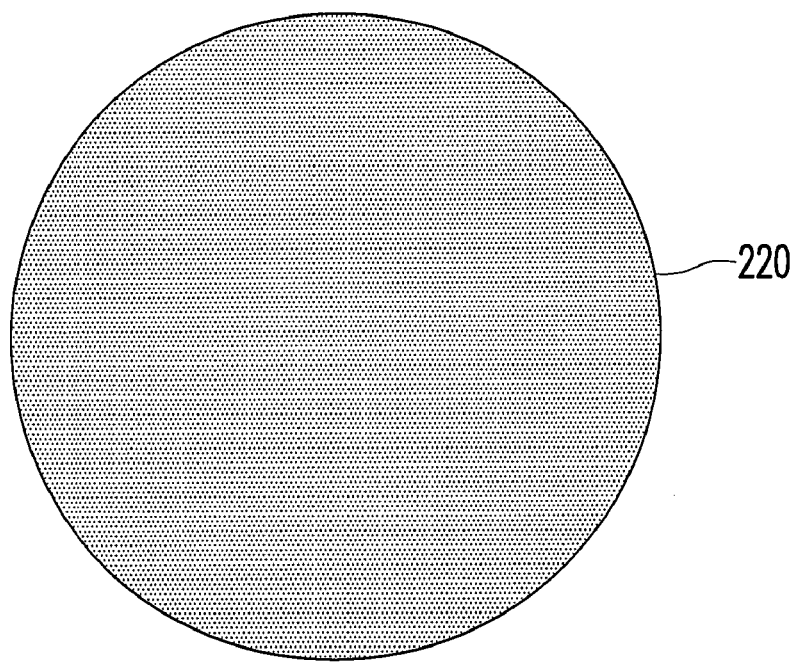

Next, as shown in FIG. 2B and in step 110 of FIG. 1, a carrier 220 whose dimension is larger than the dimension of the wafer 210 is provided. The carrier 220 includes a silicon substrate, a glass substrate, a sapphire substrate, or any other types of carrying devices. The carrier 220 is made of appropriate materials selected according to the actual demands in the present embodiment. For example, a transparent glass substrate can be used as the carrier 220 when a packaging is applied to a photosensitive device. The glass substrate can be sawed in the subsequent process of sawing the wafer 210, so as to directly construct a plurality of individual packaging devices. Moreover, if the wafer sawing method is merely implemented to divide the chip units 210a, the carrier 220 having favorable strength may be used, such that the carrier 220 is not sawed in the subsequent process of sawing the wafer 210.

Figure 2C:
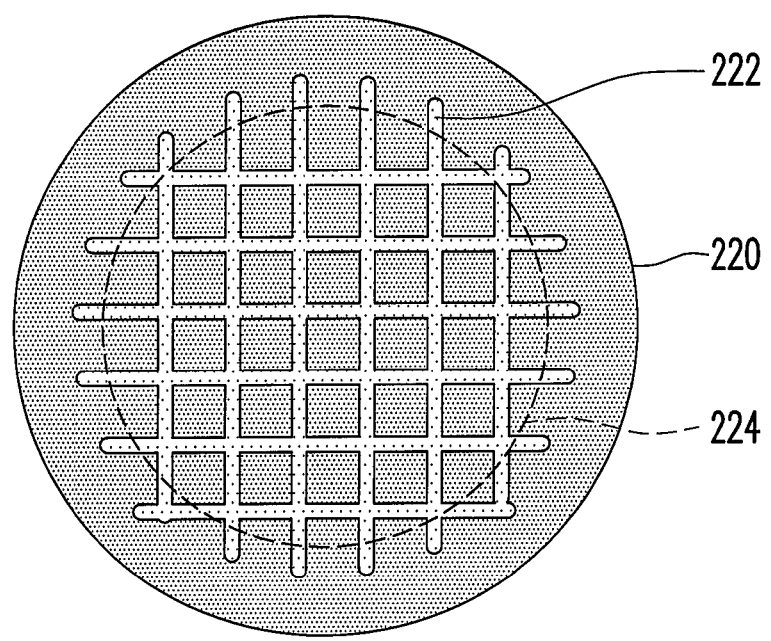

Thereafter, as shown in step 120 and in FIG. 2C, a plurality of strip-shaped adhesives 222 corresponding to the sawing paths 212 on the wafer 210 is formed on the carrier 220. Here, a currently available adhesive-coating machine is, for example, utilized for coating the adhesives on the carrier 220, so as to form the strip-shaped adhesives 222 approximately mirror symmetrical to the sawing paths 212 on the wafer 210. Further, the strip-shaped adhesives 222 are extended outside a bonding region 224 on the carrier 220. Here, the bonding region 224 on the carrier 220 is to be bonded to the wafer 210. Besides, the strip-shaped adhesives are made of polymer materials including epoxy resin, silicon-carbon resin and silicone (or silica gel), or otherwise made of other appropriate bonding materials.

Figure 2D:
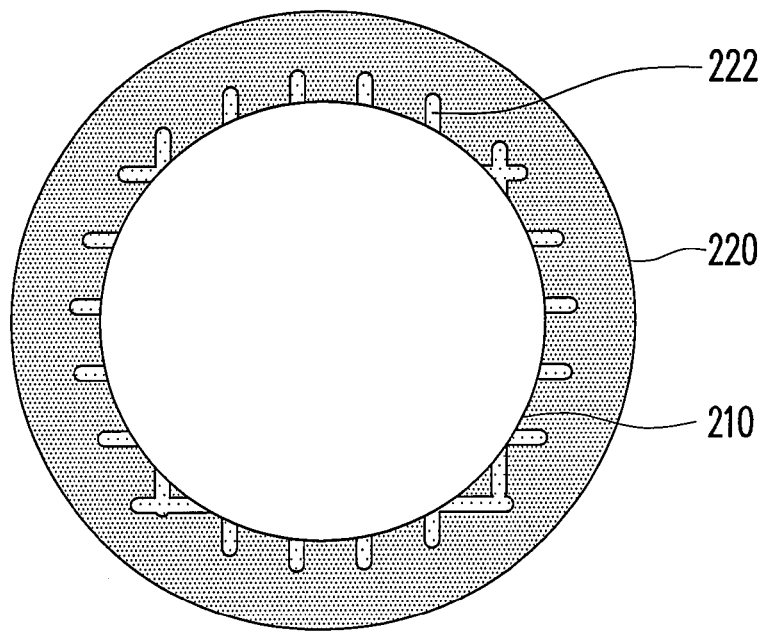
Figure 2E:
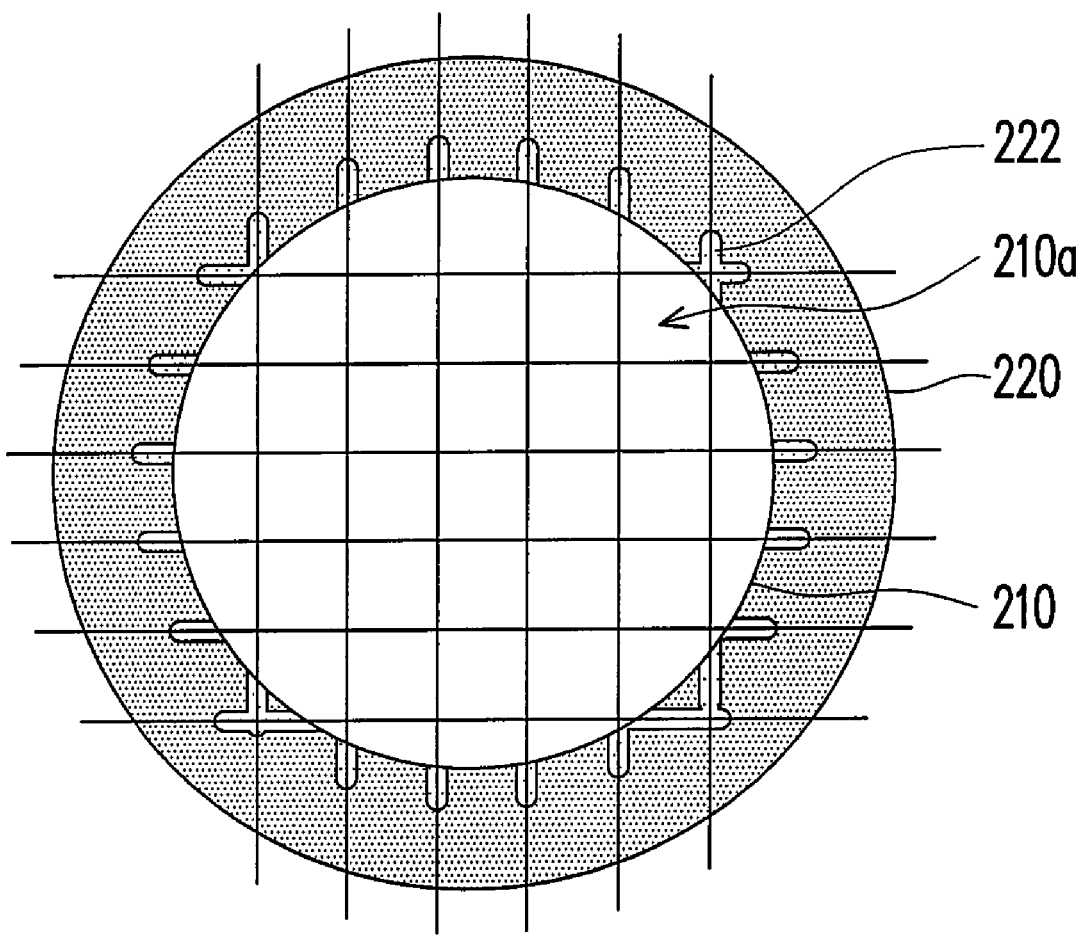
Figure 3A:
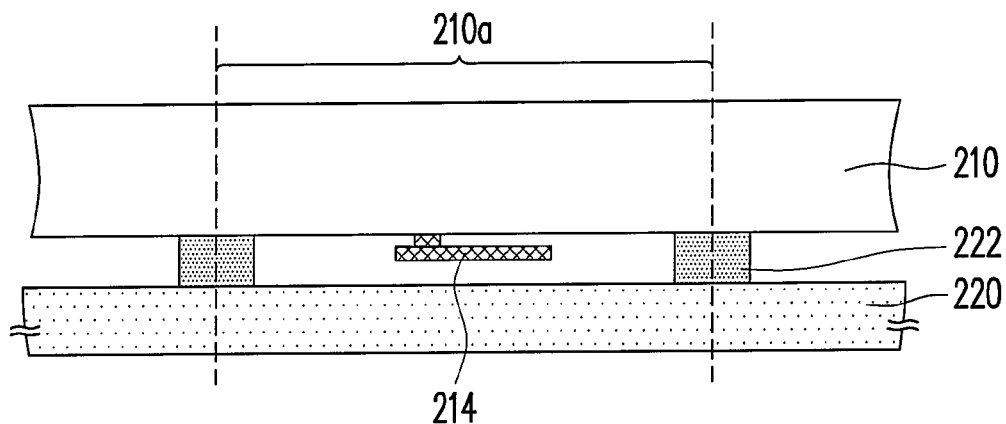
FIG. 3A is a cross-sectional view illustrating the wafer sawing step depicted in FIG. 2E.

Next, as indicated in step 130 and in FIG. 2D, the wafer 210 and the carrier 220 are bonded together. Please also refer to the cross-sectional view of the bonded wafer 210 and the carrier 220 depicted in FIG. 3A in which a reference number 214 represents the micro devices including the micro-electromechanical devices or the electro-optical devices on each of the chip units 210a. In detail, the method of bonding the wafer 210 to the carrier 220 includes disposing a surface of the wafer 210 onto the carrier 220 and connecting the wafer 210 and the carrier 220 through the strip-shaped adhesives 222. Here, the surface of the wafer 210 has the sawing paths 212 and faces the carrier 220. The sawing paths 212 on the wafer 210 are correspondingly bonded to the strip-shaped adhesives 222 on the carrier 220, while parts of the strip-shaped adhesives 222 are extended outside the bonding region 224 between the wafer 210 and the carrier 220.

Figure 3B:
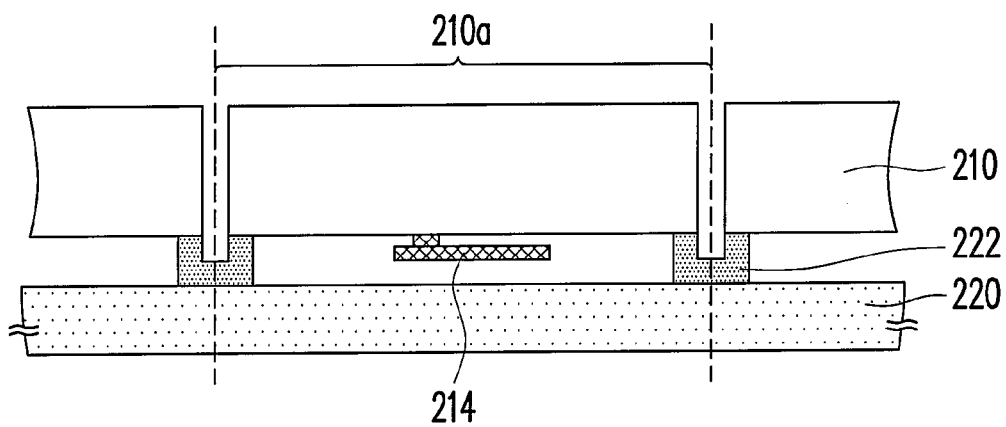
FIGS. 3B and 3C are cross-sectional views respectively illustrating the wafer sawing step depicted in FIG. 2E when sawing depths are different.
Figure 3C:
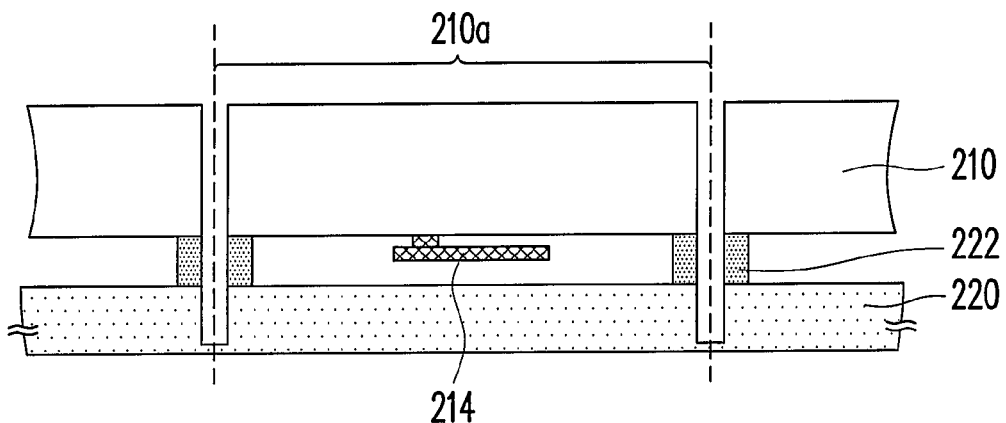

Afterwards, as shown in step 140, the cutting tool (not shown) and the carrier 220 are positioned according to the strip-shaped adhesives 222 outside the bonding region 224. Next, as indicated in step 150 and in FIG. 2E, the wafer 210 is sawed along the strip-shaped adhesives 222 (corresponding to the sawing paths 212), so as to divide the chip units 210a on the wafer 210. In this step, the sawing depth is determined upon the actual manufacturing demands. If the wafer sawing method is merely implemented for dividing the chip units 210a, as shown in the cross-sectional view illustrating the process of sawing the wafer 210 in FIG. 3B, the carrier 220 is not sawed while the sawing process is performed along the strip-shaped adhesives 222 on the wafer 210. As such, the carrier 220 can be reused, and thereby the manufacturing costs are reduced. On the other hand, if the wafer sawing method is implemented for forming a plurality of the individual packaging devices, as shown in the cross-sectional view illustrating the process of sawing the wafer 210 in FIG. 3C, the sawing process is performed on both the carrier 220 and the strip-shaped adhesives 222 of the wafer 210. During the wafer sawing operation, the cutting tool may directly cut through the carrier 220. In an alternative, a portion of the carrier 220 can be protected from being cut through when a breaking process is implemented in the wafer sawing operation for forming the individual packaging devices.

According to the previous embodiment, the cutting tool and the carrier are positioned based on the strip-shaped adhesives on the carrier. Nevertheless, the strip-shaped adhesives are not formed on the carrier when the wafer and the carrier are not bonded together through the implementation of the adhesive bonding. At this time, the fiducial mark can be formed on the carrier for positioning the cutting tool and the carrier. Undoubtedly, the fiducial mark can be used together with the strip-shaped adhesives, which will be further elaborated hereinafter.

Figure 4:
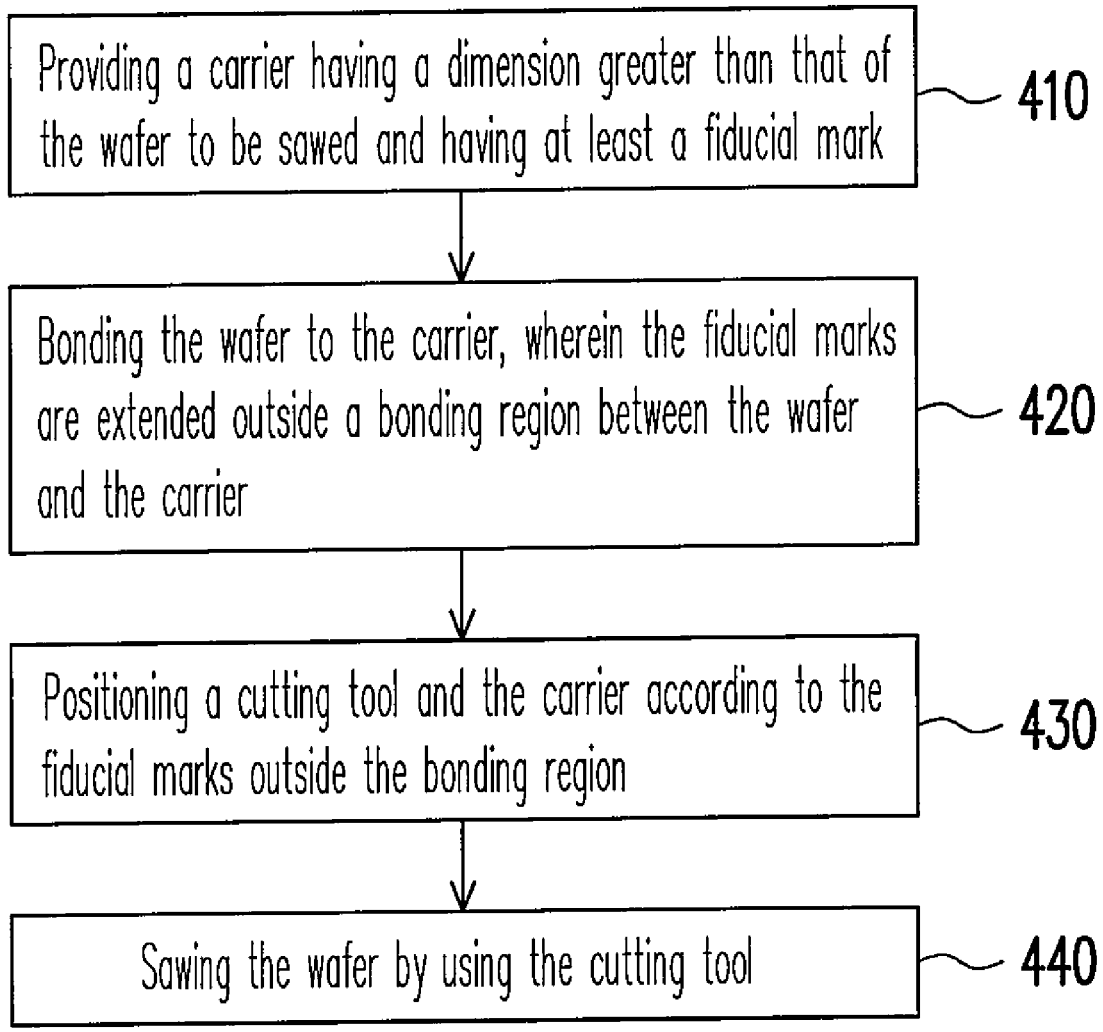
FIG. 4 is a flowchart illustrating a wafer sawing method according to another embodiment of the present invention.
Figure 5A:
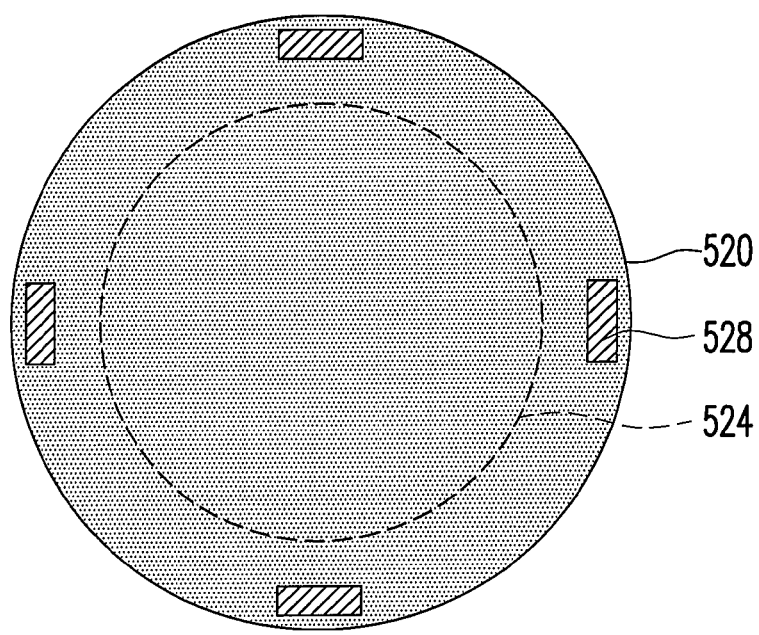
FIGS. 5A through 5C are top views sequentially illustrating the steps in the wafer sawing method depicted in FIG. 4.
Figure 5B:
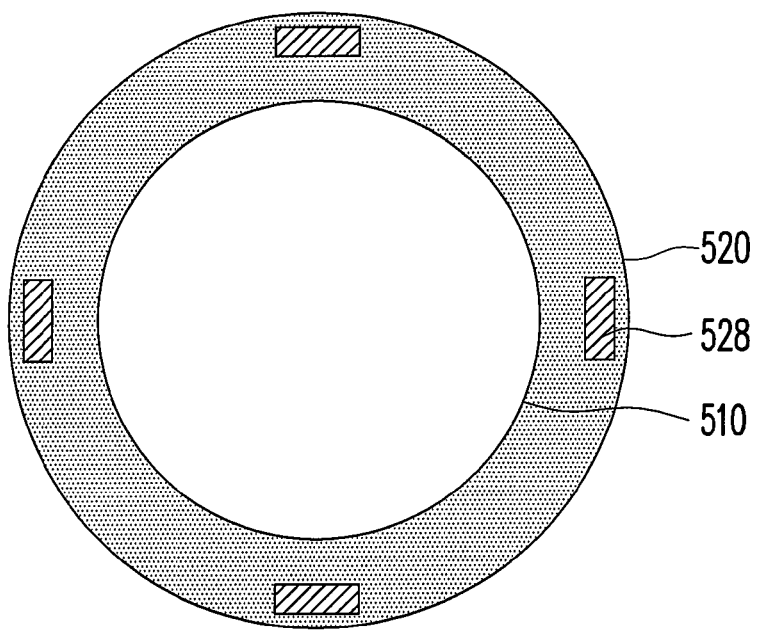
Figure 5C:
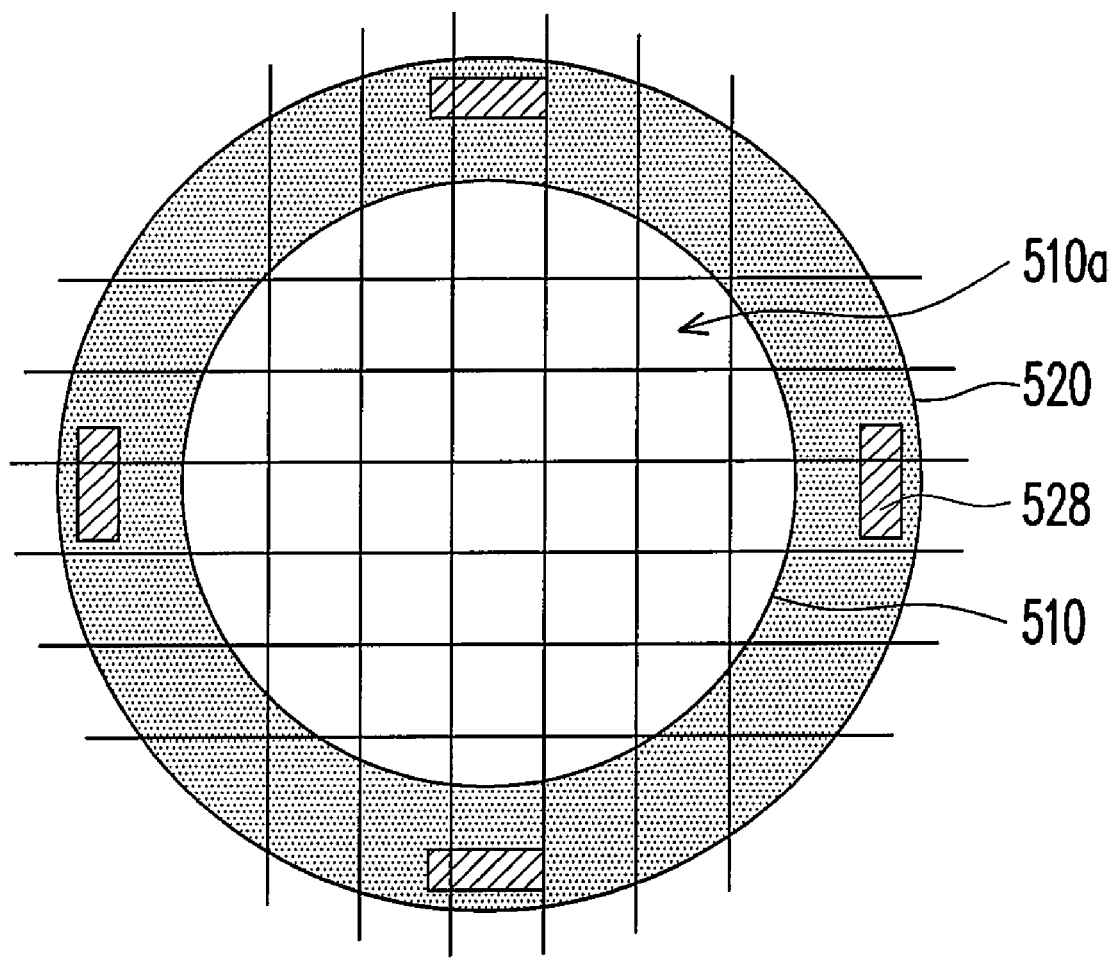

FIG. 4 is a flowchart illustrating a wafer sawing method according to another embodiment of the present invention. FIG. 5A through 5C are top views sequentially illustrating the steps in the wafer sawing method. In the wafer sawing method of the present embodiment, as indicated in step 410 and in FIG. 5A, a carrier 520 having fiducial marks 528 is provided. The fiducial marks 528 are disposed outside a bonding region 524 on the carrier 520, and the bonding region 524 is to be bonded to a wafer 510. The method of forming the fiducial marks 528 includes, for example, forming patterns made of metallic materials or other materials on the carrier 520, or conducting other processing operations. Note that the present invention poses no limitation on the patterns, the amount, or the position of the fiducial marks 528, despite the fact that four rectangular fiducial marks 528 respectively located at four sides of the carrier 520 are provided in the present embodiment. As a matter of fact, the patterns, the amount, or the position of the fiducial marks 528 can all be modified based on the actual demands.

Next, as shown in step 420 and in FIG. 5B, a surface of the wafer 510 is disposed on the carrier 520. Here, the surface of the wafer 510 faces the carrier 520 and has the sawing paths (not shown). The fiducial marks 528 are located outside the bonding region 524 between the wafer 510 and the carrier 520. In the present embodiment, the adhesive bonding is not conducted for connecting the wafer 510 to the carrier 520. Namely, the wafer 510 and the carrier 520 are not adhered to each other by means of the strip-shaped adhesives but are bonded through an anodic bonding, a eutectic bonding, or a fusion bonding. Thereafter, as indicated in step 430, the cutting tool (not shown) and the carrier 520 are positioned according to the fiducial marks 528. Besides, as shown in step 440 and in FIG. 5C, the wafer 510 is sawed, so as to divide chip units 510a on the wafer 510.

Figure 6:
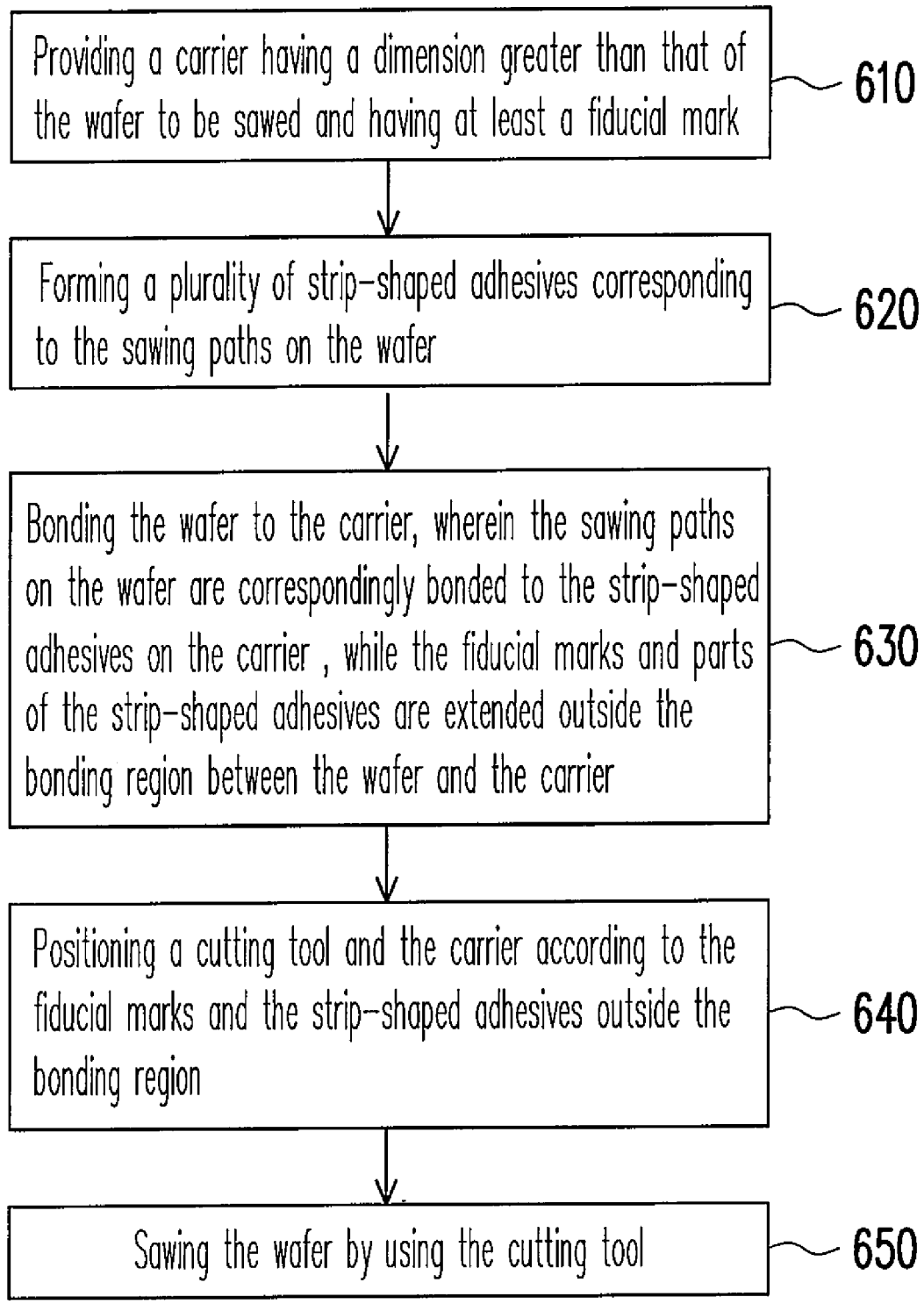
FIG. 6 is a flowchart illustrating a wafer sawing method according to still another embodiment of the present invention.
Figure 7A:
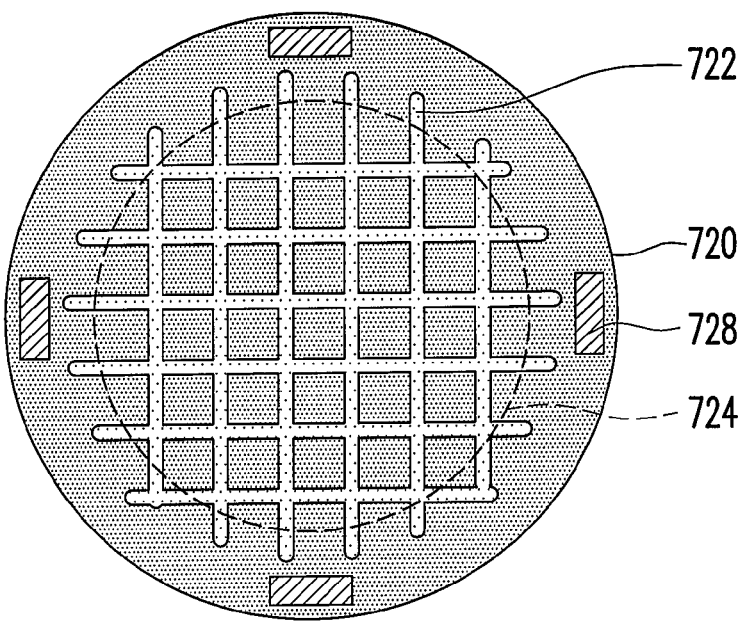
FIG. 7A through 7C are top views sequentially illustrating the steps in the wafer sawing method depicted in FIG. 6.
Figure 7B:
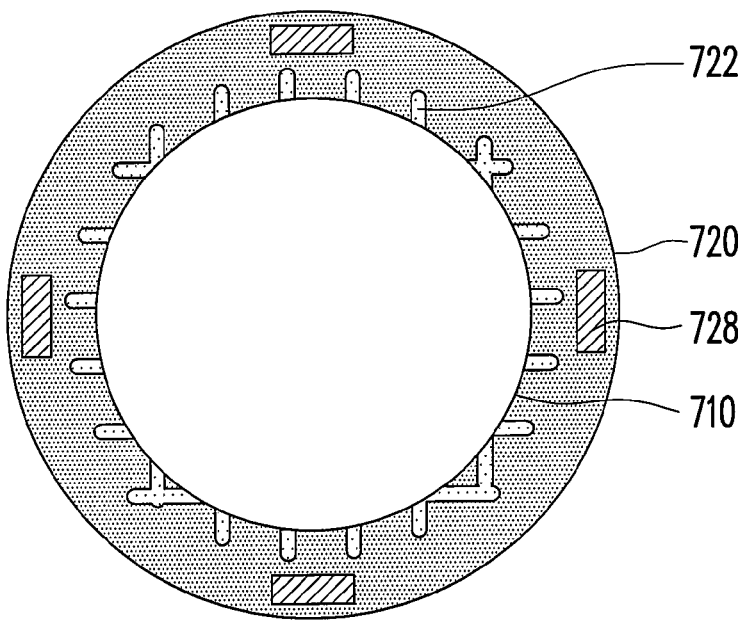
Figure 7C:
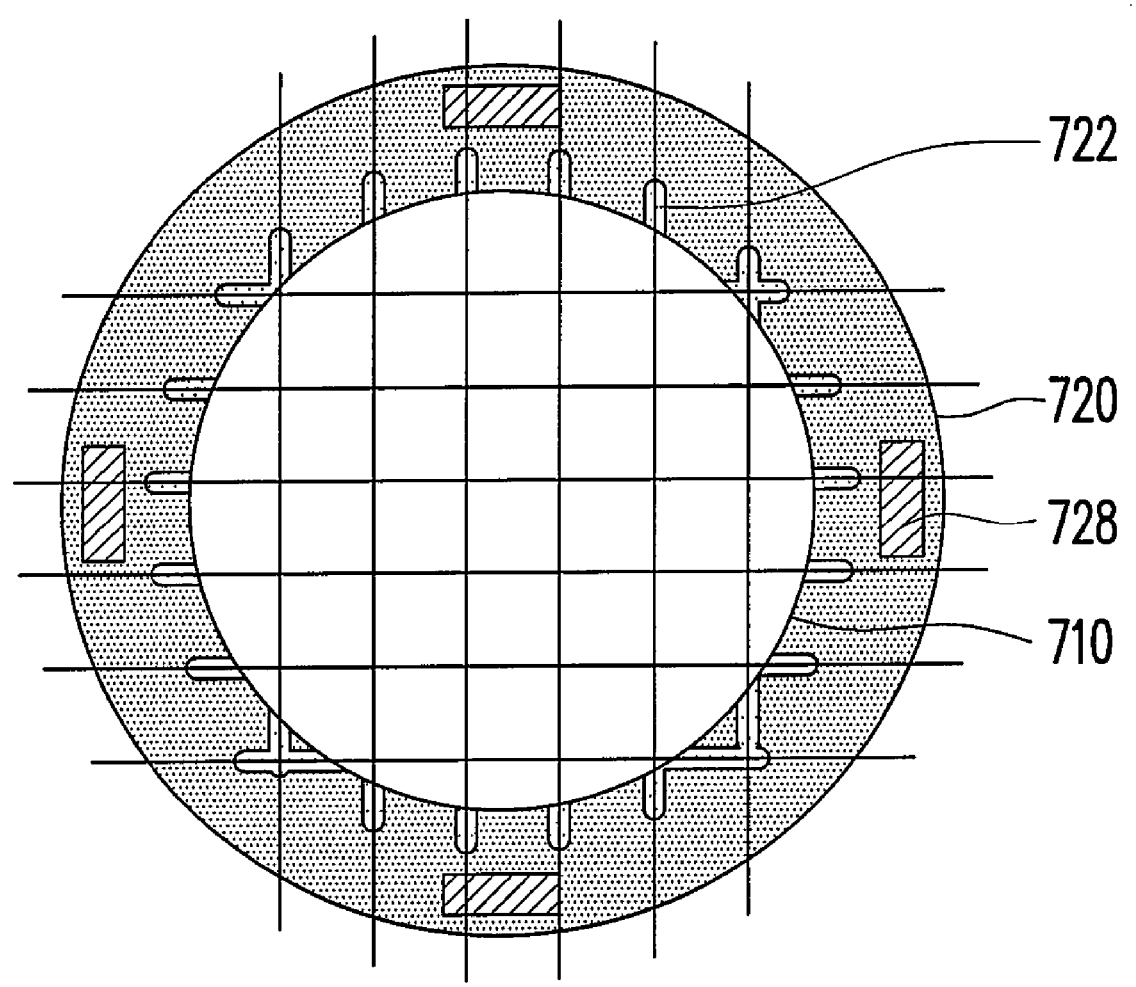

FIG. 6 is a flowchart illustrating a wafer sawing method according to still another embodiment of the present invention. FIG. 7A through 7C are top views sequentially illustrating the steps in the wafer sawing method. The wafer sawing method provided in the present embodiment combines the steps discussed in the previous two embodiments. First of all, as shown in FIG. 7A and in steps 610~620, a carrier 720 having fiducial marks 722 is provided, and a plurality of strip-shaped adhesives 722 corresponding to the sawing paths (not shown) of a wafer 710 is formed on the carrier 720. The fiducial marks 722 are disposed outside a bonding region 724 on the carrier 720, and the bonding region 724 is to be bonded to the wafer 710. Besides, parts of the strip-shaped adhesives 722 are extended outside the bonding region 724. The method of forming the fiducial marks 728 includes, for example, forming the patterns made of the metallic materials or other materials on the carrier 720, or conducting other processing operations. Likewise, the present invention poses no limitation on the patterns, the amount, or the position of the fiducial marks 728, despite the fact that four rectangular fiducial marks 728 respectively located at four sides of the carrier 720 are provided in the present embodiment. As a matter of fact, the patterns, the amount, or the position of the fiducial marks 728 can all be modified based on the actual demands.

Next, as shown in step 630 and in FIG. 7B, a surface of the wafer 710 is disposed on the carrier 720, so as to bond the wafer 710 to the carrier 720 by means of the strip-shaped adhesives 722. Here, the surface of the wafer 710 faces the carrier 720 and has the sawing paths (not shown). The fiducial marks 728 and parts of the strip-shaped adhesives 722 are located outside the bonding region 724 between the wafer 710 and the carrier 720. Thereafter, as indicated in step 640, the cutting tool (not shown) and the carrier 720 are positioned according to the fiducial marks 728 and the strip-shaped adhesives 722 exposed by the wafer 710. Besides, as shown in step 650 and in FIG. 7C, the wafer 710 is sawed, so as to divide chip units 710a on the wafer 710.

To sum up, the formation of either the strip-shaped adhesives or the fiducial mark on the carrier is determined in the wafer sawing method of the present invention, such that the cutting tool and the carrier are positioned according to the strip-shaped adhesives or the fiducial mark. Hence, even though the back surface of the wafer has no sawing lines or any other patterns for positioning, the wafer can still be precisely sawed according to the wafer sawing method proposed in the present invention, thus preventing the device or the circuits on the chips from being damaged due to the errors occurring in the sawing operation. The manufacturing yield is thereby improved. Moreover, as the accuracy of the sawing operation is guaranteed, the hermetic space between the carrier and each of the chips is not affected, so as to ensure the protection for the devices on the chips during the wafer sawing process or the subsequent processes. On the other hand, the wafer is sawed along its sides according to the wafer sawing method of the present invention. Hence, the sawing depth can be controlled based on the actual manufacturing demands. For example, the sawing process is merely performed on the wafer and the strip-shaped adhesives rather than on the carrier. As such, the carrier can be reused, so as to reduce the manufacturing costs.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A wafer sawing method for sawing a wafer by using a cutting tool, a surface of the wafer comprising a plurality of sawing paths, the wafer sawing method comprising:

providing a carrier whose dimension is greater than a dimension of the wafer, having at least a fiducial mark being formed on the carrier;

forming a plurality of strip-shaped adhesives on the carrier, corresponding to the pluraity of sawing paths on the surface of the wafer;

bonding the wafer to the carrier, wherein the surface of the wafer comrpising the plurlaity of sawing paths faces the carrier, and the fiducial mark is disposed outside a bonding region between the wafer and the carrier, wherein the plurality of strip-shaped adhesives within the bonding region is bonded to the plurlaity of sawing paths on the surface of the wafer;

positioning the cutting tool and the carrier according to the fiducial mark; and sawing the wafer by using the cutting too.

2. The wafer sawing method as claimed in claim 1, wherein the method of forming the fiducial mark comprises forming a metallic pattern on the carrier.

3. The wafer sawing method as claimed in claim 1, wherein the carrier and the wafer are simultaneously sawed by using the cutting tool.

4. The wafer sawing method as claimed in claim 1, wherein the method of bonding the wafer to the carrier comprises an anodic bonding, a eutectic bonding, or a fusion bonding.

5. The wafer sawing method as claimed in claim 1, wherein the carrier comprises a silicon substrate, a glass substrate, or a sapphire substrate.

6. The wafer sawing method as claimed in claim 1, wherein the cutting tool and the carrier are positioned according to both the fiducial mark and the plurlaity of strip-shaped adhesives outside the bonding region.

7. The wafer sawing method as claimed in claim 1, wherein the wafer is sawn along the plurlaity of strip-shaped adhesives disposed on the plurality of sawing paths.

* * * * *